United States Patent [19]

Frisch

[11] Patent Number: 4,952,820

[45] Date of Patent: Aug. 28, 1990

[54] REDUCTION OF INTERMODULATION DISTORTION IN LIGHT EMITTING DIODES

[75] Inventor: Arnold M. Frisch, Portland, Oreg.

[73] Assignee: Tektronix, Inc., Beaverton, Oreg.

[21] Appl. No.: 329,052

[22] Filed: Mar. 27, 1989

[51] Int. Cl.$^5$ .................... H03K 3/42

[52] U.S. Cl. .................... 307/311; 250/552

[58] Field of Search .................... 307/311; 250/552, 200

[56] References Cited

U.S. PATENT DOCUMENTS 4,032,802 6/1977 Pan et al. .................... 307/311

FOREIGN PATENT DOCUMENTS 0016991 2/1979 Japan .................... 307/311
0052639 4/1980 Japan .................... 307/311
2269416 11/1987 Japan .................... 307/311
1586960 3/1981 United Kingdom .................... 307/311

*Primary Examiner*—Stanley D. Miller
*Assistant Examiner*—T. Cunningham
*Attorney, Agent, or Firm*—John P. Dellett

[57] ABSTRACT

A low distortion light source comprising a light emitting diode and a compensating diode connected in parallel with respect to a D.C. bias current and in anti-series with respect to an A.C. signal source. The compensating diode is selected to have a forward resistance similar to the forward resistance of the LED. Adjusting the D.C. bias current through the diodes to be approximately equal matches the forward resistance characteristics and substantially reduces the undesired intermodulation products.

6 Claims, 4 Drawing Sheets

REDUCTION OF INTERMODULATION DISTORTION IN LIGHT EMITTING DIODES

BACKGROUND OF THE INVENTION

The present invention relates to reduction of harmonic distortion and intermodulation distortion in a light emitting or laser diode and more specifically to a circuit and method that reduces third order intermodulation distortion by substantially matching the forward non-linear conductance characteristics of a compensating diode and the light emitting or laser diode.

In U.S. Pat. No. 4,032,802 an apparatus is disclosed employing a compensating diode and a light emitting diode connected in parallel for D.C. biasing and in anti-series with respect to an A.C. signal source. The patent asserts that the non-linear junction capacitance of the LED is responsible for the undesirable harmonic distortion and intermodulation products. To reduce distortion problems, a compensating diode matching the LED as nearly as possible with respect to capacitance characteristics is selected, with the bias points of the diodes being adjusted to equalize the effects of the diode capacitances.

SUMMARY OF THE INVENTION

In accordance with the present invention in order to reduce the effects of higher order harmonic distortion in an LED, a compensating diode having a similar forward resistance is connected in parallel with the LED for D.C. biasing and in anti-series with respect to the A.C. signal source, while bias current is adjusted such that the currents through the LED and the compensating diode are substantially equal.

It is an object of the invention to reduce harmonic and intermodulation distortion in a light emitting diode.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION OF THE DRAWINGS

The present invention relates to reduction of harmonic distortion and intermodulation in light emitting diodes or laser diodes and more specifically to a circuit and method that reduces third order intermodulation distortion by substantially matching resistances and currents in the compensating diode and in the LED or laser diode. It has been found that equalizing forward resistances and currents of the diodes has a substantially greater effect on reducing distortion and intermodulation products than matching the capacitance characteristics of the diodes. The term LED or light emitting diode will be used generally herein to describe LEDs, laser diodes, or similar semiconductor light source means.

Figure 1:
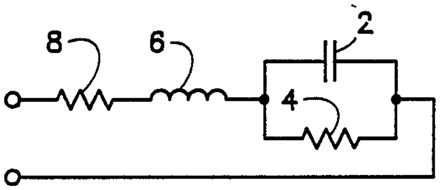
FIG. 1 (PRIOR ART)
FIG. 1 is a schematic representation of a light emitting diode.

In an LED equivalent circuit as illustrated in FIG. 1, junction capacitance 2 includes the diffusion capacitance and depletion layer capacitance, and is disposed in parallel with the forward resistance 4 of the LED. Resistor 8 in series with the LED represents the sum of the excess diode series resistance and the external circuit resistance, while series inductor 6 represents inductance mainly due to the bonding wire. In the forward biased operating region of an LED at normal operating frequencies (e.g. several hundred megahertz), the reactance of the junction capacitance is an order of magnitude greater than the forward resistance and it can be shown that changes or mismatches in the reactance of the capacitance have a limited effect when compared to variations in non-linear forward resistance characteristics. Further, the variation of capacitance with voltage is small in comparison with the variation of resistance with voltage. In fact, I have discovered that a mismatch of forward conductance of the LED and compensating diode is the actual cause of harmonic and third order intermodulation distortion rather than mismatch of junction capacitance characteristics.

Figure 2:
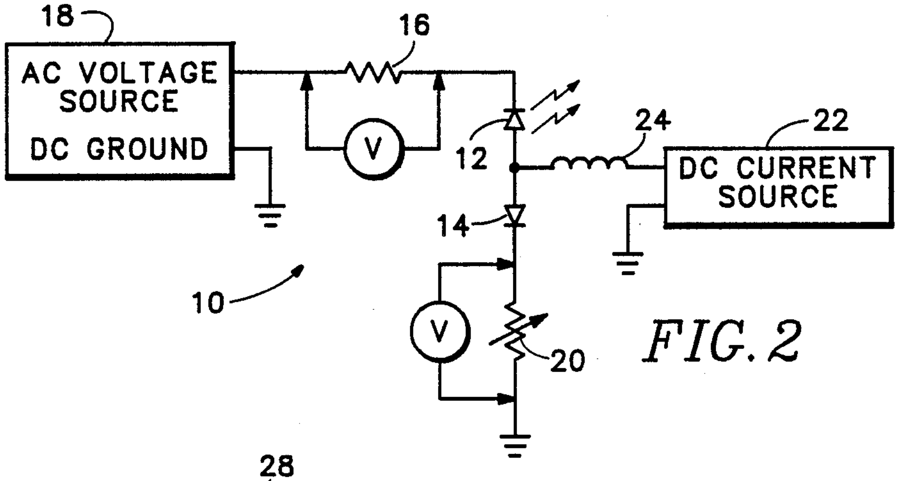
FIG. 2 is a schematic diagram of a circuit for reducing harmonic and intermodulation distortion in a light emitting diode.

FIG. 2 illustrates a circuit 10 for reducing distortion and intermodulation in an LED. LED 12 is electrically connected in anti-series (anode to anode in the illustrated case) with compensating diode 14. The cathode of LED 12 is connected to a biasing resistor 16. The remote side of resistor 16 is connected to an A.C. voltage source 18 which is returned to ground while the cathode of compensating diode 14 is connected to one terminal of a variable biasing resistor 20 having its opposite terminal grounded. The anodes of LED 12 and diode 14 are connected in parallel with respect to a D.C. current source 22 coupled to the anodes of the diodes via inductance 24 for blocking the A.C. signal. The D.C. current source is also returned to ground. Source 18 provides a D.C. ground for resistor 16, e.g. via a second inductance (not shown) in parallel with the source terminals.

Compensating diode 14 is desirably chosen to have a forward resistance characteristics (V vs. I characteristics) similar to the forward resistance characteristic of the LED and to have a capacitance value which may be on the order of but is preferably less than the capacitance of the LED. Simulations have indicated that the reduction of even ordered harmonics is principally attributable to the antiseries connection of the diodes, i.e., wherein the push-pull circuit configuration tends to cancel the even order harmonics. Simulation and experimental evidence indicate that distortion in general is relatively invariant with modulating frequency, which confirms the lack of significance of capacitance differences. Moreover, simulations show that harmonic and intermodulation distortion are reduced appreciably when the effects of forward conductance of the diodes are matched.

In one embodiment of the invention, the LED had a forward resistance of approximately 3 ohms and a capacitance of about 8 picofarads drawing about 50 milliamps of current in normal operation. At normal operating frequencies of approximately 500 Mhz, the capacitive reactance of the LED was 40 ohms or more which is substantially greater than the 3 ohm forward resistance. The compensating diode desirably should have a forward resistance as close to 3 ohms as possible (with a corresponding non-linear V vs. I characteristic) and a small capacitance, preferably 8 pf or less. Thus, the preferred consideration in regard to capacitance is that it should be low in value rather than in effect matching the capacitance of the LED. Then, to achieve a close compensating match of the LED conductance characteristics, variable resistor 20 is adjusted such that the D.C. biasing currents in the two diodes are equal, with the currents being monitored at least initially by measuring the voltage across biasing resistor 16 and biasing resistor 20 respectively. A substantially compensating match can be achieved through adjusting the currents to be equal even though the resistances of the LED and the compensating diode are not quite the same, or resistances elsewhere in the circuit aren't balanced.

Figure 3:
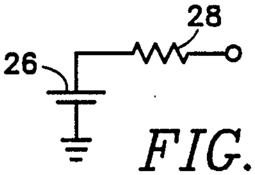
FIG. 3 (PRIOR ART)
FIG. 3 is a diagram of a D.C. bias system.

FIG. 3 illustrates a typical D.C. current source 22. Voltage source 26 in series with relatively large resistor 28 supplies the requisite D.C. bias current, wherein the resistance value of resistor 28 substantially entirely determines the current flowing in the circuit. To supply a total of 100 milliamps to the two diodes, a 6 volt supply and a 50 ohm resistor can be used. Alternatively, an active current source can be employed to conserve power.

Figure 4:
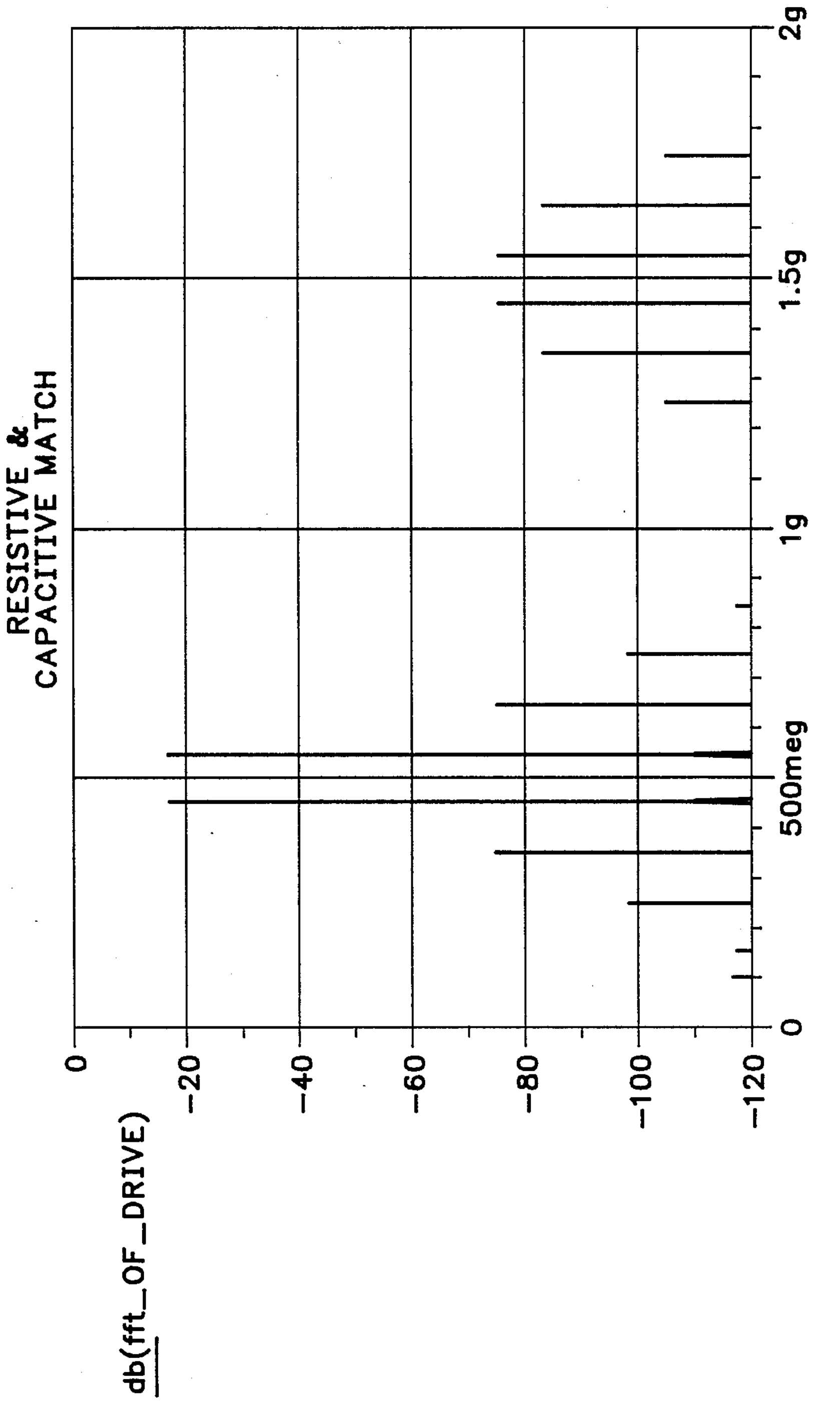
FIGS. 4–6 are plots of amplitude vs. frequency spectra for circuits employing compensating diodes of various types.
Figure 5:
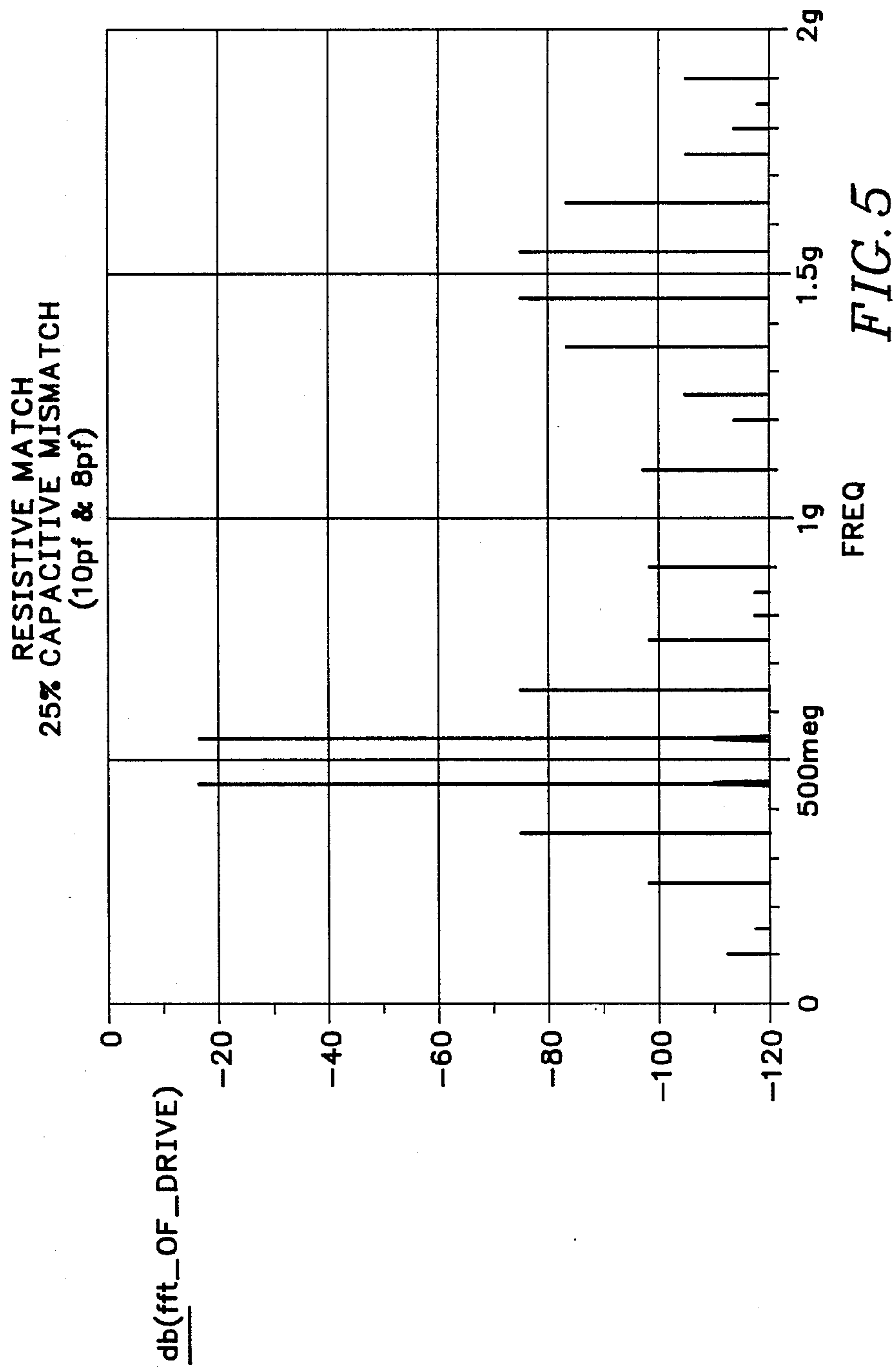
Figure 6:
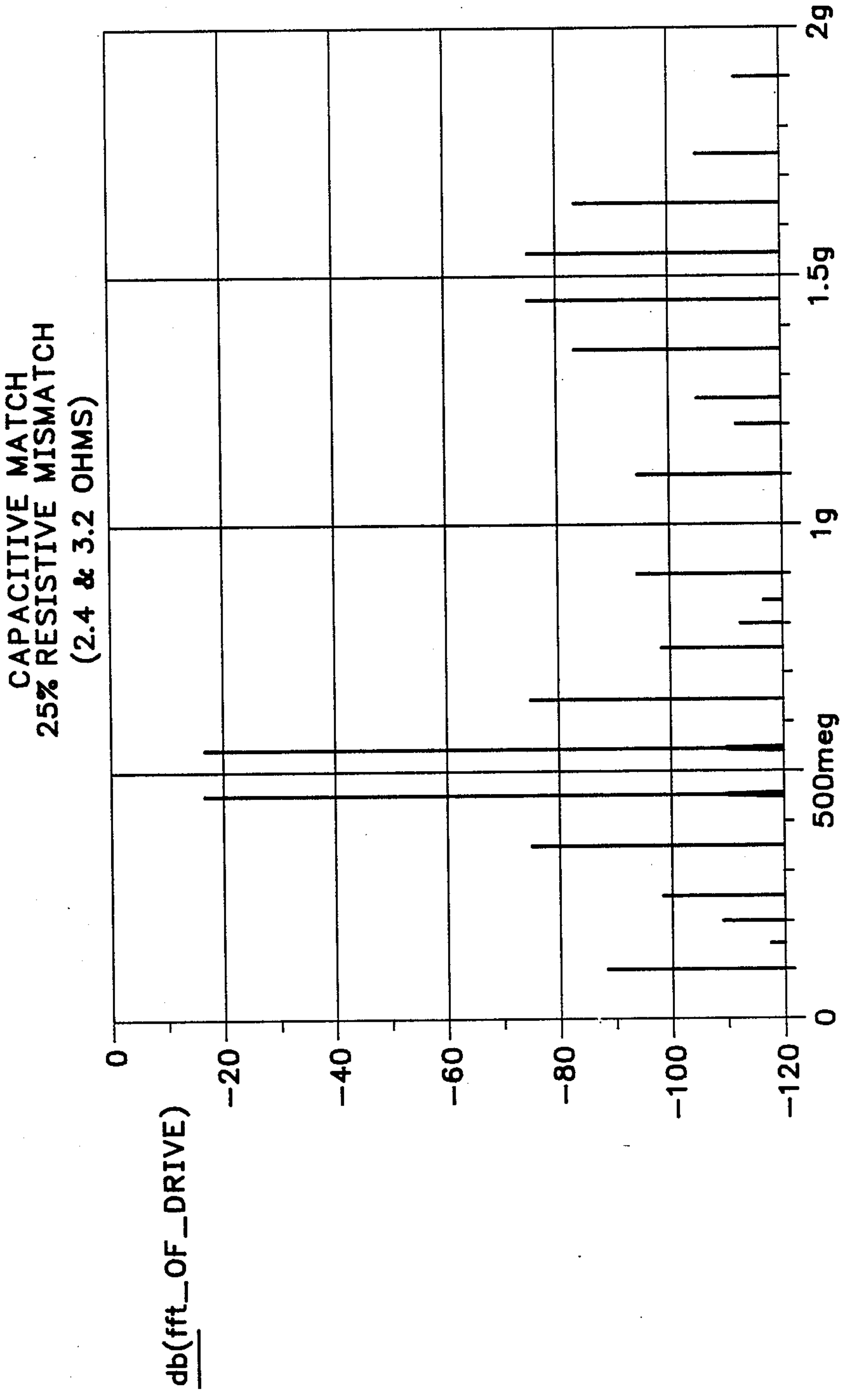

FIGS. 4–6 are plots of amplitude vs. frequency spectra, computer simulations which show the result of driving the LED and compensating diode of FIG. 2 with two input tones at frequencies of 450 and 550 Mhz. In each instance the currents are substantially equal. FIG. 4 represents the spectrum wherein capacitance and forward resistance characteristics of the LED and the compensating diode are perfectly matched. Connecting the compensating diode in anti-series with the LED reduces the distortion associated with harmonic and intermodulation products. Of particular interest are the second order harmonics and third order intermodulation products. The second harmonic frequencies are indicated by equations 1 and 2:

$$f(2har)=2*450=900 \text{ Mhz} \quad (1)$$

$$f(2har)=2*550=1100 \text{ Mhz} \quad (2)$$

In the anti-series connection, the even order harmonics will tend to cancel each other, and in the case where the diode characteristics are matched, even order harmonic distortion will be zero. As can be seen in FIG. 4, at second harmonic frequencies of 900 and 1100 Mhz, no spectral component is apparent down to a level of −120 Db. The third order intermodulation products are approximately −75 Db, 60 Db less than the magnitudes at the input (fundamental) frequencies, and appear at frequencies given by equations 3 and 4:

$$f(3Im)=(2*450)-550=350 \text{ Mhz} \quad (3)$$

$$f(3Im)=(2*550)-450=650 \text{ Mhz} \quad (4)$$

In practice, obtaining an LED and a compensating diode with less than a 25% mismatch is difficult, and therefore matching as closely as possible the particular diode characteristic affecting harmonic and intermodulation distortion to the greatest degree is important. FIG. 5 is a spectral plot associated with a 25% capacitive mismatch (the LED had 8 pf of capacitance and the compensating diode had 10 pf of capacitance) and a forward resistance match. The magnitude of the second order harmonic distortion at 900 and 1100 Mhz has increased to approximately −97 Db, whereas the capacitive mismatch does not affect the third order harmonic distortion nor the third or fifth order intermodulation products perceptively.

FIG. 6 is a spectral plot associated with a 25% resistive mismatch (the LED had 3.2 ohms of forward resistance and the compensating diode had 2.4 ohms of forward resistance), and a capacitive match. The second order harmonic distortion and the third order intermodulation product are approximately −92 Db and −72 Db respectively. The distortion levels for harmonics and intermodulation products attributable to resistive mismatch are consistently higher than the distortion levels associated with capacitive mismatch, approximately 5 Db for second order harmonic distortion and 2 Db for third order intermodulation. The 2 Db increase in the third order intermodulation product is especially important because the distortion level for the third order intermodulation product is already significant and increases three times faster than the magnitude of the fundamental as input power is increased.

Figure 7:
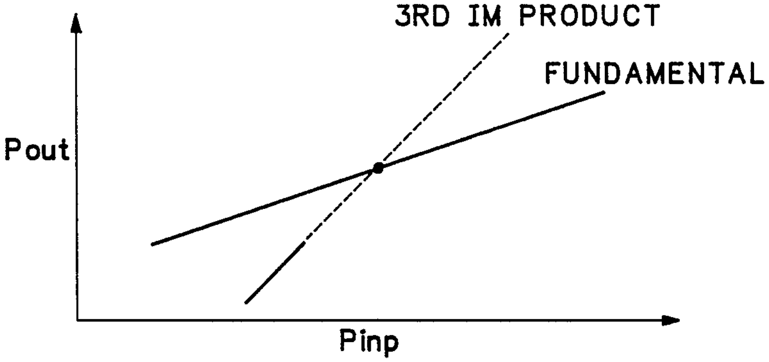
FIG. 7 is a plot of output power vs. input power for such a circuit.

FIG. 7 is a plot of output power vs. input power for the fundamental frequencies (450 and 550 Mhz) and the third order intermodulation frequencies. The fundamental power varies linearly with a slope of one, whereas the third order intermodulation product increases with a slope of three as input power is increased. These lines intersect at a point referred to as the third order intermodulation intercept, whereby for input power levels exceeding the intercept point the intermodulation power surpasses the fundamental output power. For normal operation, it is desirable to stay well below the intercept point such that the third order intermodulation product is much less (e.g. −60 Db) than the output power at the fundamental frequency. Furthermore, the fifth order intermodulation product (not shown) varies linearly with a slope of five and may also surpass the power at the fundamental frequency if the input power is too high.

Resistive mismatch effectively shifts the intercept point to the left thereby lowering the power input at the intersection and increasing distortion in the signal. A change of 1 Db in input power will result in a 3 Db increase in the third order intermodulation product distortion, and therefore the 2 Db difference in intermodulation distortion between resistive and capacitive mismatch becomes very significant.

At lower driving frequencies such as 45 and 55 Mhz, the distortion caused by capacitive mismatch decreases substantially whereas the distortion associated with resistive mismatch remains the same. At frequencies much above 500 Mhz, an effect associated with the relaxation oscillation frequency becomes more dominant and prevents the achievement of such low values of intermodulation distortion. Relaxation oscillation frequency is a device property associated with the semiconductor material, processing methods, and device dimensions.

Simulations, as shown by FIGS. 4–6, have been substantiated by experimental evidence leading to the conclusion that a compensating diode connected in anti-series with an LED for the purpose of reducing harmonic and intermodulation distortion should be selected and tuned to match forward resistance characteristics as closely as possible.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A low distortion light source for use with an A.C. signal source, comprising:

semiconductor light source means, compensating means having a forward resistance characteristic substantially similar to that of said light source means, said light source means and said compensating means being connected in anti-series with the signal source, and first biasing means for applying a biasing current through said light source means and second biasing means for applying a biasing current through said compensating means, wherein said first and second biasing means provide substantially equal biasing currents through said light source means and said compensating means.

2. The light source as recited in claim 1 wherein said first and second biasing means include first and second separate resistors for coupling current to the respective light source means and compensating means.

3. The light source as recited in claim 1 wherein said light source means is characterized by a parallel capacitance value, and said compensating means is characterized by a parallel capacitance value on the same order but preferably less than the capacitance value of said light source means.

4. The light source as recited in claim 1 wherein said compensating means comprises a diode.

5. The light source as recited in claim 1 wherein one of said first and second biasing means comprises a resistor with an alterable resistance value.

6. A method for reducing distortion in a semiconductor light source means having a forward resistance connected in series with an A.C. signal source, comprising:

coupling a compensating diode having a forward resistance characteristic approximately equal to the forward resistance characteristic of the semiconductor light source means in anti-series with the semiconductor light source means, coupling bias current to said semiconductor light source means, coupling bias current to said compensating diode, and adjusting the value of the bias current in the semiconductor light source means and in said compensating diode to be substantially equal.

* * * * *